US007115895B2

(12) United States Patent
von Känel

(10) Patent No.: US 7,115,895 B2
(45) Date of Patent: Oct. 3, 2006

(54) FORMATION OF HIGH-MOBILITY SILICON—GERMANIUM STRUCTURES BY LOW-ENERGY PLASMA ENHANCED CHEMICAL VAPOR DEPOSITION

(75) Inventor: Hans von Känel, Wallisellen (CH)

(73) Assignee: Eidgenoessische Technische Hochschule Zurich, Zurich (CH)

( * ) Notice: Subject to any disclaimer, the term of this patent is extended or adjusted under 35 U.S.C. 154(b) by 116 days.

(21) Appl. No.: 10/496,245

(22) PCT Filed: Sep. 5, 2002

(86) PCT No.: PCT/EP02/09922

§ 371 (c)(1), (2), (4) Date: Jan. 24, 2005

(87) PCT Pub. No.: WO03/044839

PCT Pub. Date: May 30, 2003

(65) Prior Publication Data

US 2005/0116226 A1 Jun. 2, 2005

(30) Foreign Application Priority Data

Nov. 22, 2001 (EP) ................................. 01127834

(51) Int. Cl.
*H01L 21/20* (2006.01)

(52) U.S. Cl. ........................................ 257/11; 438/481

(58) Field of Classification Search ................ 438/758, 438/492, 481, 172, 22
See application file for complete search history.

*Primary Examiner*—Carl Whitehead, Jr.
*Assistant Examiner*—Monica D. Harrison
(74) *Attorney, Agent, or Firm*—Moetteli & Associes SaRL; John Moetteli

(57) ABSTRACT

Method for making a semiconductor structures comprising the steps:—forming a virtual substrate on a silicon substrate with a graded $Si_{1-x}Ge_x$ layer and a non-graded $Si_{1-x}Ge_x$ layer, using a high-density, low-energy plasma enhanced chemical vapor deposition (LEPECVD) process with a growth rate above 2 nm/s, a substrate temperature between 400° and 850° C., and a total reactive gas flow at the gas inlet between 5 sccm and 200 sccm;—forming an active region on the virtual substrate that comprises a Ge-channel and at least one modulation-doped layer using a low-density, low-energy plasma enhanced chemical vapor deposition (LEPECVD) process by introducing hydrogen ($H_2$) into the growth chamber, maintaining a substrate temperature between 400° and 500° C., and by introducing a dopant gas in a pulsed manner into the growth chamber to provide for the modulation-doped layer.

10 Claims, 6 Drawing Sheets

20

25
30
31
33
29
23
Gas
26
28
24
Ar
22
27
21
32
-
+

FORMATION OF HIGH-MOBILITY SILICON—GERMANIUM STRUCTURES BY LOW-ENERGY PLASMA ENHANCED CHEMICAL VAPOR DEPOSITION

The present invention concerns the formation of silicon-germanium structures, in particular heterostructures, showing a drastically increased hole mobility. Modulation-doped field-effect transistor structures (e.g., MODFET structures) and modulation-doped quantum well structures (e.g., MODQW structures), for instance, can be made using the process presented hereinafter.

BACKGROUND OF THE INVENTION

New materials and material compositions are being employed in industry in order to improve semiconductor devices such as transistors, for example. This allows to improve the processing speed and performance of integrated circuits (ICs).

A typical example is the deployment of Silicon-Germanium (SiGe) on Silicon. An example of a well-known SiGe heterostructure device 10 is illustrated in FIG. 1. The device 10 comprises a (001)-oriented silicon substrate 11. A graded SiGe-layer 12 is situated on top of the Si substrate 11. The layer 12 allows for a gradual modification of the lattice constant starting from the silicon's lattice constant to a constant that is mainly determined by the concentration of the Ge in the SiGe-layer 12. In the given example, a constant composition buffer layer 13 is formed on top of the graded SiGe-layer 12. The SiGe-layer 12 together with the buffer layer 13 serve as a virtual substrate for the layers that are formed in subsequent process steps. A stack of active device layers 14 is formed on the virtual substrate. The concentration of Ge is depicted in the graph 15 on the left hand side of the device 10. The Ge concentration (x) in the SiGe-layer 12 is gradually increased from x=0 to $x=x_f$. The layer 12 is typically several microns thick in order to ensure that the defect concentration is low.

There are several widely used processes for making such SiGe devices 10. Molecular beam epitaxy (MBE) and ultra-high vacuum chemical vapor deposition (UHV-CVD) are just two examples. Using these processes the fabrication of Ge-rich SiGe structures and devices is difficult. It is another disadvantage of the known approaches that the growth rate is low. Since a certain minimum thickness of the SiGe-layer 12 is required to guarantee an acceptable level of the defect concentration, the formation of this layer takes quite some time. This is, however, highly unfavorable for industrial mass production.

There are two different UHV-CVD processes. The first one is called hot-wall UHV-CVD and the second one is called cold-wall UHV-CVD or rapid thermal CVD (RTCVD).

Hot-wall CVD is well suited for batch processing and is carried out at low, typically between 450° and 550° C., substrate temperatures. Strained Si-channels on SiGe-buffers can be made using hot-wall UHV-CVD. Very high electron mobilities of more than $10^5$ $cm^2/Vs$ have been reported by is mail et al. in "Extremely high electron mobilities in Si/SiGe modulation-doped heterostructures", Appl. Phys. Lett, Vol. 66, p. 1077, 1995. The hot-wall UHV-CVD has several disadvantages, such as

- low growth rate on the order of about nm/min at substrate temperatures around 550° C. for pure Si, as reported by B. S. Meyerson et al. in "Cooperative growth phenomena in silicon/germanium low-temperature epitaxy", Appl. Phys. Lett., Vol. 53, p. 2555, 1988;
- large surface roughness caused by so-called cross-hatch due to relaxation. The cross-hatch effect is more prominent the steeper the gradient of concentration (grading rate) is. The difference in altitude between hills and grooves is typically about 30 nm even at the surface of a buffer layer with a comparatively low Ge concentration of $x_f$=0.3 at the surface. The surface roughness has a detrimental effect on the quality of MODFETs, as described by M. Arafa et al. in "Device and fabrication issues of high performance Si/SiGe Fets", Nat. Sci. Soc., Symp. Proc. Vol. 533, p. 83, 1998.
- The hot-wall process is difficult to control in particular at high Ge-concentrations, as described by P. M. Mooney et al. in "SiGe technology: heteroepitaxy and high-speed microelectronics", Annu. Rev. Mater. Sci., Vol. 30, pp. 335, 2000. The hot-wall process is thus not suited for high mobility hole transport. High performance p-MODFETs with pure Ge channels thus cannot be made using the hot-wall technique.

Cold-wall CVD is suited for processing single wafers. This process is typically carried out at temperatures above 700° C. First results concerning graded SiGe buffer layers can be found in a paper written by E. A. Fitzgerald et al., entitled "Totally relaxed $Ge_xSi_{x-1}$ layers with low threading dislocation densities grown on Si substrates", Appl. Phys. Lett., Vol. 59, p. 811, 1991. At substrate temperatures between 800° and 900° C. the surface roughness is even greater than the surface roughness of layers made by the hot-wall process. An RMS-roughness of 30 nm at a $Si_{0.7}Ge_{0.3}$-buffer has been reported with a tendency to an even stronger surface roughness when the Ge-concentration in the buffer layer is increased. Details are given in "Novel dislocation structure and surface morphology effects in relaxed Ge/Si—Ge(graded)/Si structures", S. B. Samavedan et al., J. Appl. Phys, Vol. 81, p. 3108, 1997.

A SiGe buffer where the concentration is graded such that 100% Ge is obtained at the buffer layer's surface are very rough, when made using cold-wall UHV-CVD (RMS-roughness greater than 30 nm). Heterostructure devices cannot be formed on these rough surfaces without applying a chemical-mechanical polishing (CMP) process. For details refer to "Controlling threading dislocation densities in Ge on Si using graded SiGe layers and chemical-mechanical polishing", E. A. Fitzgerald et al., Appl. Phys. Lett, Vol. 72, p. 1718, 1998.

Until now, no MODFET structures and high-mobility hole transport devices have been made and reported using cold-wall UHV-CVD for the entire layer stack.

Another well-known process technology is called low-pressure chemical vapor deposition (LPCVD). As reported by A. C. Churchill et al. in "High-mobility two-dimensional electron gases in Si/SiGe heterostructures on relaxed SiGe layers grown at high temperature" Semicond. Sci. Technol., Vol. 12, p. 943, 1998, the relatively high process temperatures in an LPCVD process also lead to a remarkable surface roughness. This is even the case at a grading rate of less than 10%/μm. At a Ge-concentration of $x_f$=0.24 at the buffer surface and a substrate temperature of 800° C., an RMS-roughness of up to 6 nm was reported. For details see "Mosaic crystal tilts and their relationship to dislocation structure, surface roughness and growth conditions in relaxed SiGe layers", by D. J. Wallis et al., Mat. Res. Soc. Symp. Proc., 533, p. 77, 1998.

A graded buffer layer with a Ge-concentration of 100% (i.e., $x_f=1$) at the surface shows an even larger roughness with an RMS of 160 nm.

LPCVD, like cold-wall UHV-CVD, is not suited for making structures that require a high hole mobility.

As mentioned above, MBE is another process that is widely used for making semiconductor structures. A virtual substrate (layers 12 and 13 in FIG. 1) can be made using an MBE process without facing serious problems. Since the chemical composition of the layers is to a large extent independent of the substrate temperature, the relaxation and surface roughness of the virtual substrate layer can be optimized by choosing an appropriate temperature profile and grading rate, as addressed by J.-H. Li et al. in "Strain relaxation and surface morphology of compositionally graded Si/$Si_{1-x}Ge_x$ buffers", J. Vac. Sci. Technol., Vol. B 16, p. 1610, 1998 and in E. A. Fitzgerald et al., APL, Vol. 59, p. 811, 1991.

The most serious disadvantage of MBE is the limited capacity of the evaporation crucibles. This is a disadvantage in particular when growing thick SiGe-buffer layers, as described by T. Hackbarth et al. in "Alternatives to thick MBE-grown relaxed SiGe buffers", Thin Solid Films, Vol. 369, p. 148, 2000. MBE is thus not well suited for an industrial production of SiGe devices.

For devices with Ge-rich compressively strained channels on a virtual substrate, there is a tendency for a three-dimensional growth. In particular pure Ge-layers show a remarkable surface roughness, except when the layers are grown at low substrate temperature around 300° C. At such low temperatures, however, the electrical properties of the devices are not acceptable anymore.

It is an object of the present invention to provide a method for making improved SiGe structures, such as MODFET structures or MODQW structures.

It is an object of the present invention to provide a method for making SiGe devices with improved hole conductivity.

It is an object of the present invention to provide improved SiGe heterostructure devices.

It is an object of the present invention to provide a growth system for carrying out a method for making SiGe devices.

SUMMARY OF THE PRESENT INVENTION

The present invention relies on a low-energy plasma enhanced chemical vapor deposition (LEPECVD) process.

According to the present invention, a method for making semiconductor structures is proposed. It comprises the step:

forming a virtual substrate on a silicon substrate with a graded $Si_{1-x}Ge_x$ layer and a non-graded $Si_{1-x}Ge_x$ layer, using a high-density, low-energy plasma enhanced chemical vapor deposition (LEPECVD) process with a growth rate above 2 nm/s, a substrate temperature between 400° and 850° C., and a total reactive gas flow at the gas inlet between 5 sccm and 200 sccm.

Furthermore, the method comprises the step:

forming an active region on the virtual substrate that comprises a Ge-channel and at least one modulation-doped layer using a low-density, low-energy plasma enhanced chemical vapor deposition (LEPECVD) process by introducing hydrogen ($H_2$) into the growth chamber, maintaining a substrate temperature between 400° and 500° C., and by introducing a dopant gas in a pulsed manner into the growth chamber to provide for the modulation-doped layer.

Various advantageous methods are claimed in the dependent claims 2 through 10.

According to the present invention, a semiconductor device is proposed. It comprises a silicon substrate, a graded $Si_{1-x}Ge_x$ layer, a $Si_{1-x}Ge_x$ buffer layer with constant concentration of Ge, an active region situated on said $Si_{1-x}Ge_x$ buffer layer. The active region comprises at least one modulation-doped layer and a Ge channel having a hole mobility between 70000 and 87000 $cm^2/Vs$ at 4.2K.

According to the present invention, a growth system is proposed. It comprises a growth chamber with a gas inlet. It is equipped for carrying out a low-energy plasma enhanced chemical vapor deposition (LEPECVD) process comprising at least two process steps, whereby during a first process step system parameters are adjusted to a substrate temperature between 400° and 850° C., and a total reactive gas flow at the gas inlet between 5 sccm and 200 sccm so as to allow a growth rate above 2 nm/s, a second process step system parameters are adjusted to maintain a substrate temperature between 400° and 500° C., to feed hydrogen ($H_2$) into the growth chamber, and to feed a dopant gas in a pulsed manner into the growth chamber to allow modulation-doping of at least one layer, It is an advantage of the invention presented herein, that the obstacles and disadvantages of known approaches can be circumvented or even avoided. Devices can be realized with hitherto unknown hole mobility. The growth rate was drastically increased thus allowing the inventive process to be used for industrial manufacturing of semiconductor devices. Further advantages become obvious from the detailed description.

BRIEF DESCRIPTION OF THE DRAWINGS

For a more complete description of the present invention and for further objects and advantages thereof, reference is made to the following description, taken in conjunction with the accompanying drawings, in which.

DETAILED DESCRIPTION

The present invention takes advantage of the principle of strained layer epitaxy when two materials with different lattice parameters are grown on top of one another. When germanium (Ge), for example, is deposited on top of a substrate with a smaller lattice parameter, the Ge atoms line up with the atoms underneath, compressively straining the Ge. In the strained Ge, for example the holes experience less resistance and have the ability to flow faster. This effect can be used to realize devices that are faster without having to shrink the size of the individual devices.

The silicon has slightly smaller spaces between the atoms than the germanium crystal lattice. A SiGe-layer thus has a lattice constant that is larger than the lattice constant of silicon. The lattice constant of SiGe increases with increasing concentration of the Ge.

Figure 2:
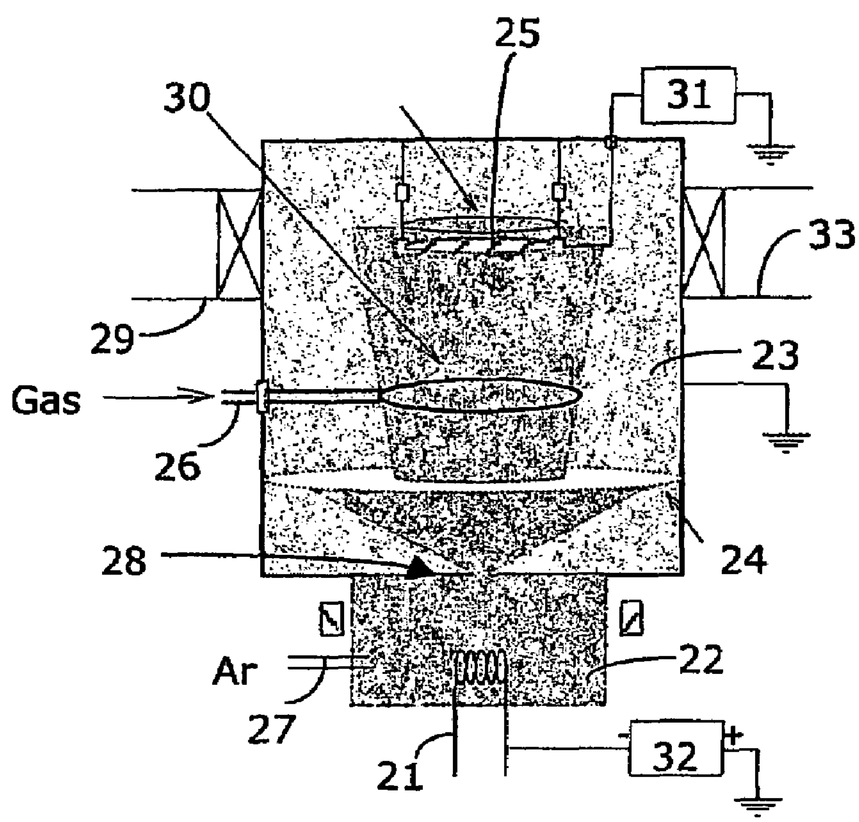
FIG. 2 is a schematic cross-section of a low-energy plasma enhanced chemical vapor deposition (LEPECVD) system, according to the present invention.

The present invention relies on low-energy plasma enhanced chemical vapor deposition (LEPECD). A typical LEPECVD system 20 is depicted in FIG. 2. LEPECVD is based on a low-voltage DC arc discharge between a hot filament 21 in a plasma chamber 22 and the walls of the growth chamber 23 and/or an auxiliary anode 24. A substrate 25 on which a SiGe-layer is to be formed is exposed directly to the high-intensity but low-energy plasma. The potential of the substrate is around −12 V for example in order to exclude any damage by high-energy ions. An appropriate bias is applied by means of a bias control unit 31. The LEPECVD is characterized in that the plasma potential is close to 0 V. The necessary reactive gases (e.g., $H_2$, $SiH_4$, $GeH_4$, $PH_3$) are fed through a port 26 and a gas inlet 30 directly into the growth chamber 23, while the argon (Ar) discharge gas is supplied through a port 27 to the plasma chamber 22 attached to the growth chamber 23 and separated from it by a small orifice 28. The high intensity of the plasma leads to very efficient cracking of the precursor gases (e.g., $SiH_4$, $GeH_4$, etc.), resulting in extraordinarily high growth rates of Si and SiGe films. The growth rates are further enhanced by confining of the plasma in a magnetic field generated by coils wrapped around the growth chamber 23. An appropriate voltage is used to drive an AC current through the filament 21. This current (about 120 A) heats the filament 21 to the desired temperature. In addition, a DC voltage source 32 (about 25V) between the filament 21 and ground is used to generate the arc discharge. The system 20 further comprises a turbomolecular pump 29.

Further details of LEPECVD systems are addressed in the PCT patent application WO 98/58099, for example. Details of this PCT patent application are incorporated by means of reference.

It is an advantage of an LEPECVD system that very high plasma densities can be achieved. According to the present invention, such a high density plasma is used for the growth of the virtual substrate. The cracking of the reactive gases is very efficient in a high density plasma thus increasing the growth kinetics. Extremely high growth rates of up to 10 nm/s are possible at substrate temperatures between 400° C. and 850° C. Other than in conventional CVD systems, the growth rate in an LEPECVD system is almost completely independent of the substrate temperature in the given temperature range.

It has been demonstrated that according to the present invention the SiGe growth rate in an LEPECVD system is almost independent of the concentration of the gas reactants in the growth chamber at a constant total flow. In conventional CVD systems there is a strong dependency between the growth rate and the gas concentrations.

Figure 3:
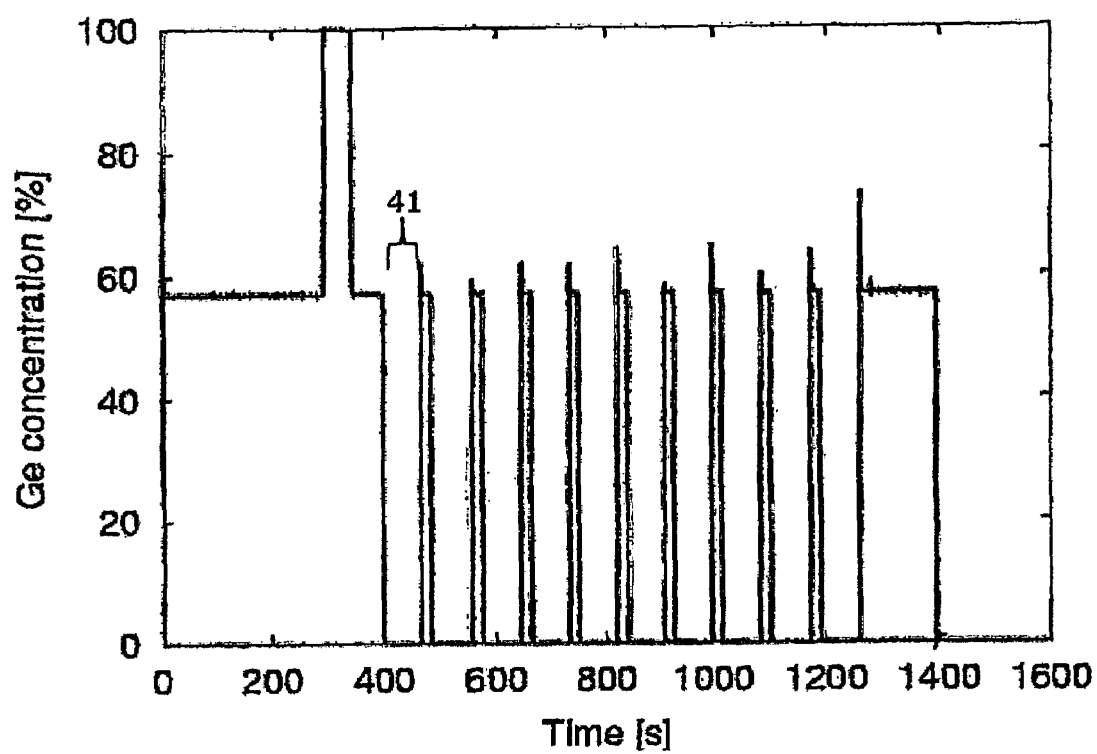
FIG. 3 is a schematic diagram illustrating the Ge concentration as a function of time, according to the present invention.
Figure 5:
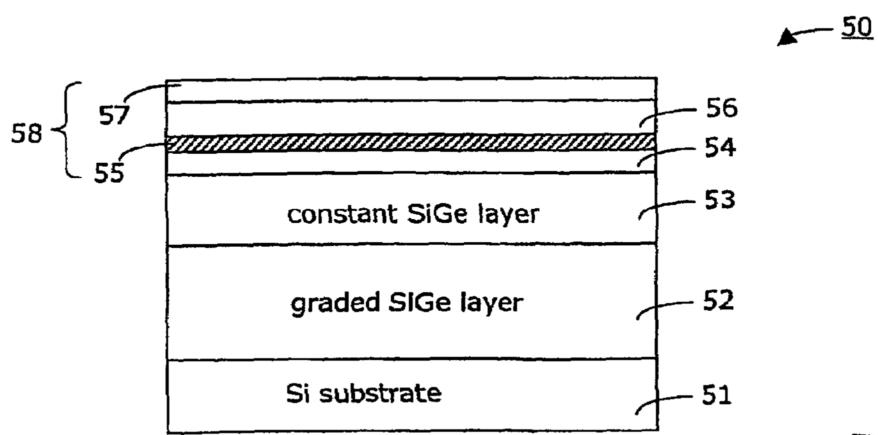
FIG. 5 is a schematic cross-section of a SiGe heterostructure semiconductor device, according to the present invention.

According to the present invention, a process called modulation doping is used, whereby the doping is carried out in an LEPECVD system like the one described in connection with FIG. 2. The basic principle of modulation doping is very much the same as with other growth methods. The doped layer is not in direct contact with the hole carrying channel, as for example described in the paper published by Xie et al., in Appl. Phys. Lett., Vol. 63, p. 2263, 1993. A typical example of how the doping is done is depicted in FIG. 3, where the Ge concentration is shown as a function of the time in seconds. In this figure, the Ge flow is illustrated prior, during, and after the growing of the Ge-channel, as such. The doping is realized by 10 di-boran pulses 41 each having a duration of about 70 s. During these di-borane pulses 41 the Ge flow is reduced to zero. A corresponding heterostructure device 50, in accordance with the present invention, is illustrated in FIG. 5. It comprises a Si substrate 51 on which a virtual SiGe substrate is formed. The virtual substrate comprises a graded SiGe layer 52 and a buffer layer 53 with constant Ge concentration. Please note that the thicknesses of the various layers are not drawn to scale. An active region 58 is situated on the virtual substrate. It comprises a cladding layer 54 which has a Ge concentration that is lower than the Ge concentration in the layer 53. On top of the cladding layer 54 a Ge channel 55 is situated. This channel 55 is covered by a modulation doped cladding layer 56 and a Si cap layer 57. The two cladding layers 54 and 56 with reduced Ge concentration provide for a strain compensation in the active region 58.

Figure 4:
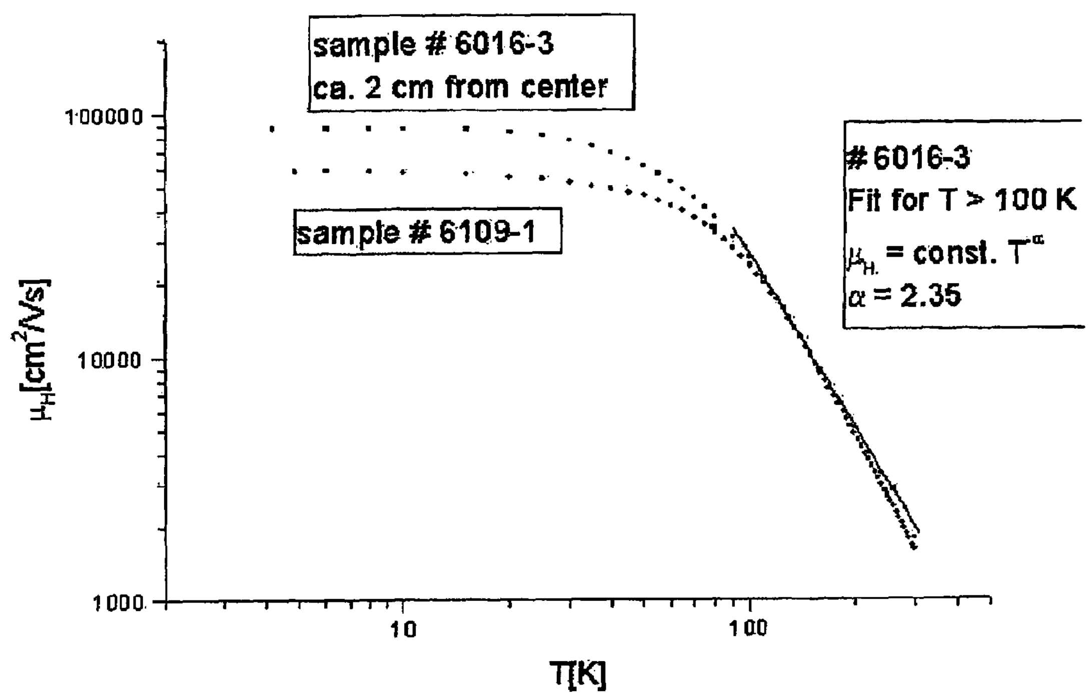
FIG. 4 is a schematic diagram illustrating the hole mobility as a function of the temperature for different samples, according to the present invention.

FIG. 4 shows the hole mobility (in $cm^2/Vs$) as a function of the temperature (in Kelvin) that can be achieved in pure Ge-channels using the process according to the present invention. Mobilities between 70000 and 87000 $cm^2/Vs$ at 4.2K can be obtained using the inventive process. In particular the mobility of 87000 $cm^2/Vs$ is to be noted. This mobility is much greater than the best mobility, presently 55000 $cm^2/Vs$ (at 4.2K), reported so far in literature (cf. the above-mentioned paper published by Xie et al.). The carrier density in both cases is about the same, namely $6.18\times10^{11}$ $cm^{-2}$ for the LEPECVD sample and $5.5\times10^{11}$ $cm^{31\ 2}$ for the MBE sample by Xie et al. Note that in the latter case due to the rough surface, the modulation doping had to be carried out in a layer underneath the Ge-channel. This configuration where the modulation doping step is carried out prior to the formation of the channel is disadvantageous, since dopants are likely to diffuse or segregate into the channel. Moreover, due to the large distance between the doped layer and the gate, this configuration is not well suited for transistor-based applications.

Using an LEPECVD system to carry out the inventive process steps, synthetic devices with very high hole mobility can be grown at very high growth rates. When the SiGe-layer 12 (cf. FIG. 1) is graded at 10%/μm with $x_f$=70% and a thickness of 8 μm, and the thickness of the layer 13 is about 1 μm, a growth rate of about 5–10 nm/s can be achieved. Typical growth rates in an MBE system are between 0.1 and 0.3 nm/s. The growth rates in a UHV-CVD system are at least another order of magnitude lower at comparable substrate temperatures.

According to the present invention, low substrate temperatures between 400° and 850° C., preferably in the range between 450° and 750° C., are used. Furthermore, during the formation of the virtual substrate the density of the plasma is kept approximately 10 times as high as that used during the epitaxial growth of the active region.

Last but not least, during the growth of the active region, $H_2$ is introduced into the growth chamber 23 where it acts as a surfactant reducing the diffusion of the Si and Ge atoms at the surface. This allows to reduce the three-dimensional growth. It allows to make active regions having well defined (sharp) interfaces. Such well defined interfaces cannot be realized using a standard MBE process.

For MODFET applications in particular the mobility at room temperature is crucial. An analysis of a device made using the inventive process reveals a maximum hole mobility in a modulation doped Ge-channel of about 3000 $cm^2/Vs$ at 293 K. This value is to be compared with a hole mobility of 1700 $cm^2/Vs$ which has been achieved using an MBE process. This is the best mobility that has been realized using MBE. Details are addressed in the paper by Madhavi et al. in J. Appl. Phys., Vol. 89, p. 2497, 2001.

Figure 1:
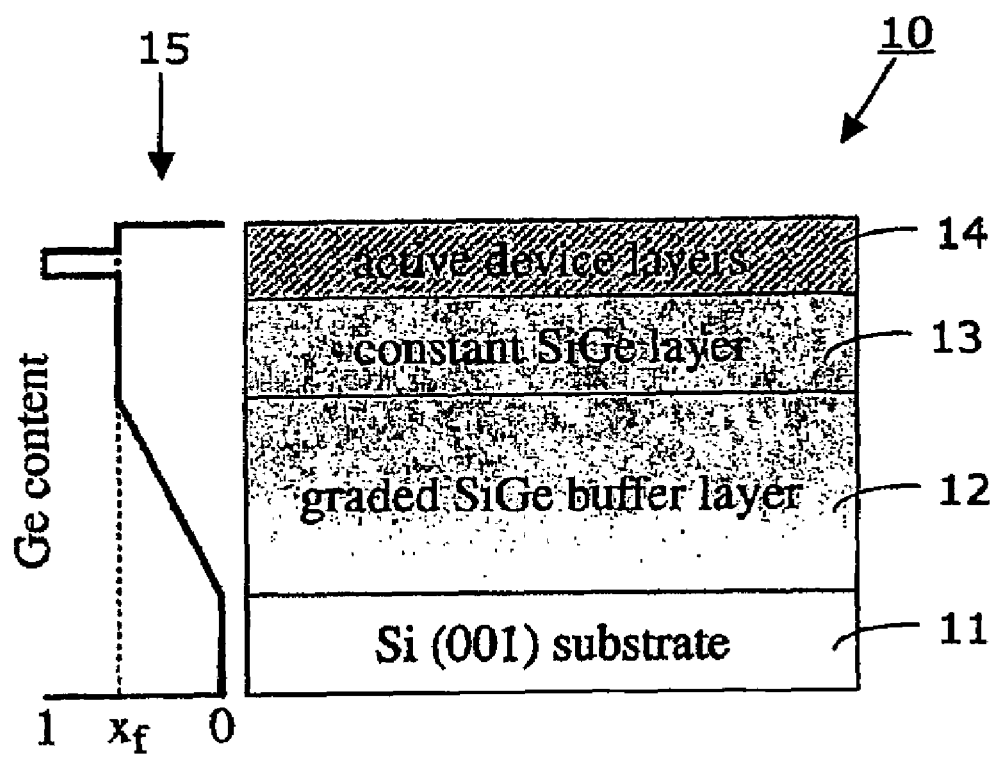
FIG. 1 is a schematic cross-section of a SiGe heterostructure semiconductor device.

The device 10 in FIG. 1 can be improved by adding a cladding layer on each side of the strained Ge-channel, as illustrated in FIG. 5. In this case, the two cladding layers together with the channel form the active device layer 14. The Ge concentration of these cladding layers might be x=60%, for example for a concentration of layer 13 of x=70%. Their thickness could be about 150 nm each. Since the Ge concentration is lower than the Ge concentration in layer 13, the cladding layers are tensilely strained, whereas the Ge-channel shows compressive strain.

According to another embodiment of the invention, the substrate temperature is intentionally altered during formation of the virtual substrate. This is possible since the growth rate in an LEPECVD system is almost completely independent of the substrate temperature in the temperature range between 400° and 850° C.

Figure 6:
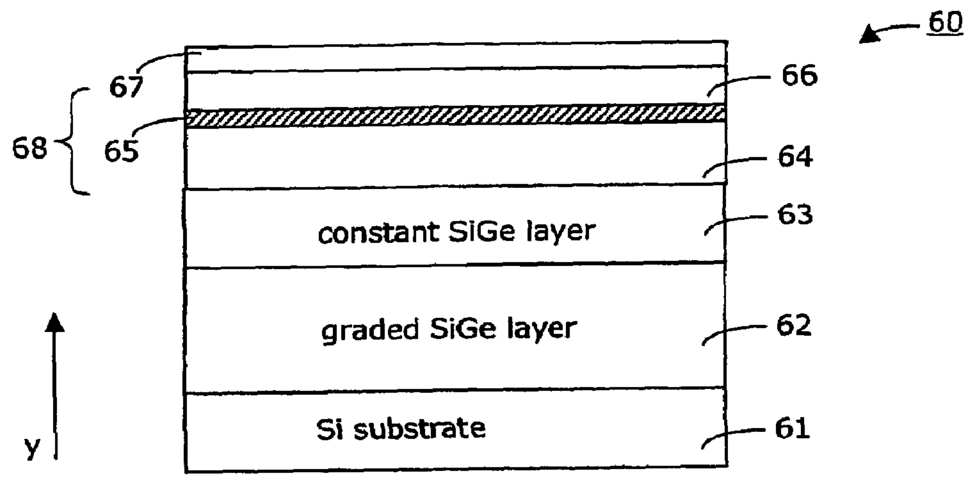
FIG. 6 is a schematic cross-section of another SiGe heterostructure semiconductor device, according to the present invention.
Figure 7:
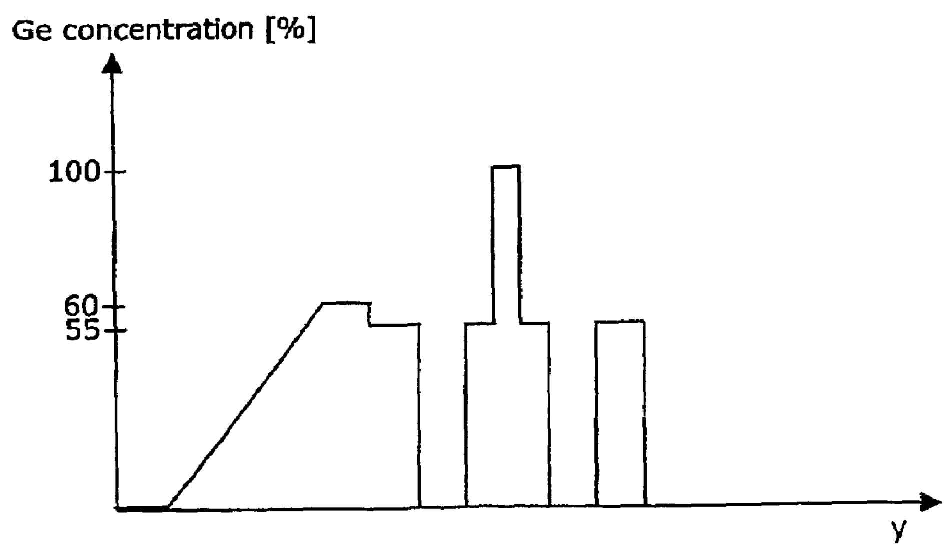
FIG. 7 is a schematic diagram illustrating the Ge concentration as a function of time, according to the present invention.

Yet another embodiment is illustrated in FIGS. 6 and 7. The device 60 is similar to the one that is illustrated in FIG. 5. It comprises a Si substrate 61 on which a virtual SiGe substrate is formed. The virtual substrate comprises a graded SiGe layer 62 and a buffer layer 63 with constant Ge concentration where the concentration x=0.6. Please note that the thickness of the various layers are not drawn to scale. An active region 68 is situated on the virtual substrate. It comprises a cladding layer 64 which has a Ge concentration x=0.55 that is lower than the Ge concentration in the layer 63. The cladding layer 64 comprises the modulation doping. The Ge channel 65 is situated on top of the modulation doped cladding layer 64. This channel 65 is covered by another modulation doped cladding layer 66 and a Si cap layer 67. The two cladding layers with reduced Ge concentration provide for a strain compensation in the active region 68. The Ge concentration profile is depicted in FIG. 7. Note that each of the modulation doped layers 64 and 66 only comprise one doping spike.

A method for making a semiconductor structure, in accordance with the present invention, comprises the following steps:

- forming a virtual substrate on a silicon substrate, comprising a graded $Si_{1-x}Ge_x$ layer with $0 \leqq x \leqq x_f$, and a $Si_{1-x}Ge_x$ layer with constant concentration of Ge (with $x=x_f$) using a high-density, low-energy plasma enhanced chemical vapor deposition (LEPECVD) process with
  - i. a growth rate above 2 nm/s,
  - ii. a substrate temperature between 400° and 850° C., and
  - iii. a total reactive gas flow at the gas inlet of the growth chamber between 5 sccm and 200 sccm;
- forming an active region on said virtual substrate comprising a Ge-channel and at least one modulation-doped layer using a low-density, low-energy plasma enhanced chemical vapor deposition (LEPECVD) process by
  - i. introducing hydrogen ($H_2$) into the growth chamber where it acts as a surfactant,
  - ii. maintaining a substrate temperature between 400° and 500° C., and
  - iii. introducing a dopant gas in a pulsed manner into the growth chamber to provide for the modulation doped layer.

The inventive process can be altered in many ways.

Figure 8:
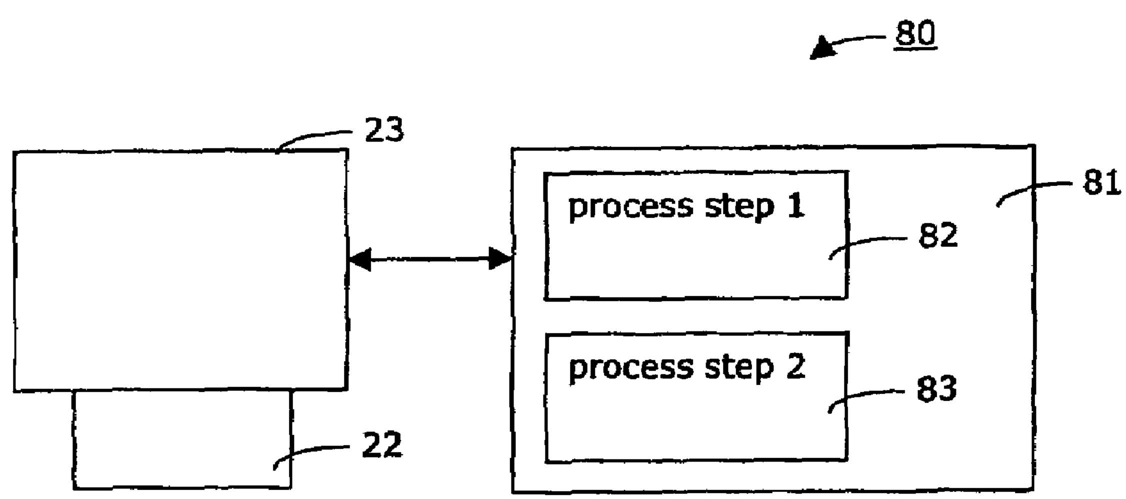
FIG. 8 is a schematic block-diagram of a growth system, according to the present invention.

A special growth system 80, in accordance with the present invention, can be realized to allow the inventive process to be employed for automatic processing. An example is illustrated in FIG. 8. Such a growth system 80 comprises a growth chamber 23 with a gas inlet and other components, similar to the one illustrated in FIG. 2. The growth system 80 is equipped for carrying out a low-energy plasma enhanced chemical vapor deposition (LEPECVD) process comprising at least two process steps. During the first process step the system parameters are adjusted to a substrate temperature between 400° and 850° C., and a total reactive gas flow at the gas inlet between 5 sccm and 200 sccm so as to allow a growth rate above 2 nm/s. During the second process step the system parameters are adjusted to maintain a substrate temperature between 400° and 500° C. Furthermore, hydrogen ($H_2$) is being fed into the growth chamber 23 during the second process step and a dopant gas is fed into the chamber 23 in a pulsed manner to allow modulation-doping of at least one layer.

The growth system 80 may comprise a process control unit 81, preferably a computer with appropriate software modules 82 and 83, for controlling the system parameters in accordance with the present invention, as schematically illustrated in FIG. 8.

With the process according to the present invention, SiGe layers can be formed having an RMS surface roughness of 5 nm and less.

The inventive concept is well suited for use in transistors, sensors, spectroscopy, quantum computers, and other devices/systems.

The invention claimed is:

1. Method for making a semiconductor heterostructure in a growth chamber (23) with gas inlet (26, 30), comprising the steps:

- forming a virtual substrate on a silicon substrate (11; 51; 61), comprising a graded $Si_{1-x}Ge_x$ layer (12; 52; 62) followed by a $Si_{1-x}Ge_x$ layer (13; 53; 63) with constant concentration of Ge, using a high-density, low-energy plasma enhanced chemical vapor deposition (LEPECVD) process with
  - i. a growth rate above 2 nm/s,
  - ii. a substrate temperature between 400° and 850° C., and
  - iii. a total reactive gas flow at the gas inlet between 5 sccm and 200 sccm,
- forming an active region (14; 58; 69) on said virtual substrate comprising a Ge-channel (55; 65) and a modulation-doped layer (56; 64, 67) using a low-density, low-energy plasma enhanced chemical vapor deposition (LEPECVD) process by
  - i. introducing hydrogen ($H_2$) into the growth chamber (23) to act as a surfactant,
  - ii. maintaining a substrate temperature between 400° and 500° C.,
  - iii. introducing a dopant gas in a pulsed manner into the growth chamber (23) to provide for the modulation-doped layer (56; 64, 67).

2. The process of claim 1, whereby during the formation of the virtual substrate the substrate temperature is intentionally altered in the given range between 400° and 800° C., preferably between 450° and 750° C.

3. The process of claim 1 or 2, whereby the substrate temperature during the formation of the active region (14; 58; 68) is maintained at about 450° C.

4. The process of claim 1, whereby di-boran is used as dopant gas.

5. The process of one of the preceding claims, whereby the substrate has a potential of about −12 Volts and the plasma potential is close to 0 Volt.

6. The process of claim 1 or 2, whereby $SiH_4$ and $GeH_4$ are introduced through the gas inlet (26; 30) into the growth chamber (23).

7. The process of claim 1 or 2, whereby the growth rate is between 2 nm/s and about 10 nm/s.

8. The process of claim 7, whereby the growth rate is almost completely independent of the substrate temperature in the given temperature range between 400° and 850° C.

9. The process of one of the proceeding claims, whereby the growth rate at constant total flow is almost completely independent of the concentration of the reactive gases in the growth chamber (23).

10. The process of one of the preceding claims, whereby the density of the high-density, low-energy plasma is 10 times as high as the density of the low-density, low-energy plasma.

* * * * *